US012810913B2

(12) United States Patent
Hwang

(10) Patent No.: US 12,810,913 B2
(45) Date of Patent: Nov. 24, 2026

(54) MEMORY DEVICE INCLUDING RACETRACK AND OPERATING METHOD THEREOF

(71) Applicant: Samsung Electronics Co., Ltd., Suwon-si (KR)

(72) Inventor: Youngnam Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 437 days.

(21) Appl. No.: 18/177,982

(22) Filed: Mar. 3, 2023

(65) Prior Publication Data

US 2023/0335172 A1 Oct. 19, 2023

(30) Foreign Application Priority Data

Apr. 19, 2022 (KR) ........................ 10-2022-0048301

(51) Int. Cl.
*G11C 11/16* (2006.01)

(52) U.S. Cl.
CPC ...... *G11C 11/1657* (2013.01); *G11C 11/1655* (2013.01); *G11C 11/1673* (2013.01); *G11C 11/1675* (2013.01)

(58) Field of Classification Search
CPC ............ G11C 11/1657; G11C 11/1655; G11C 11/1673; G11C 11/1675
USPC ..................................................... 365/230.06
See application file for complete search history.

(56) References Cited

U.S. PATENT DOCUMENTS 7,626,844 B1 12/2009 Moriya et al.
7,965,468 B2 6/2011 Rhie
8,331,125 B2 12/2012 Debrosse
9,905,310 B2 2/2018 Moon et al.
10,062,449 B2 8/2018 Choe
10,885,961 B2 1/2021 Apalkov et al.
11,087,809 B2 * 8/2021 Katayama ........... G11C 11/1657
(Continued)

FOREIGN PATENT DOCUMENTS

KR 101164888 B1 7/2012
KR 102043252 B1 11/2019
KR 102254252 B1 5/2021

OTHER PUBLICATIONS

Honda, Syuta , et al., "Skyrmion-Based Racetrack Memory With Continuous Loop Built From Ferromagnetic Metal and Insulator", Sep. 2018 • IEEE Transactions on Magnetics pp. 99:1-4.

*Primary Examiner* — Amir Zarabian
(74) *Attorney, Agent, or Firm* — Wolf, Greenfield & Sacks, P.C.

(57) ABSTRACT

A memory device and an operating method of the memory device are provided. The memory device includes a plurality of first racetracks each including a series of domains, a bit line driver connected to first sides of ones of the plurality of first racetracks, a first domain index controller configured to shift domains of ones of the plurality of first racetracks, a plurality of first magnetic tunnel junction (MTJ) devices adjacent to the plurality of first racetracks, a plurality of first cell transistors respectively connected to ones of the plurality of first MTJ devices, and a source line driver connected to the plurality of first cell transistors by a plurality of first source lines, wherein the series of domains includes a series of domain sections, and the plurality of first MTJ devices are respectively adjacent to the series of domain sections.

17 Claims, 14 Drawing Sheets

(56) References Cited

U.S. PATENT DOCUMENTS

| | | | |
|---|---|---|---|
| 11,151,439 | B2 | 10/2021 | Ouyang et al. |
| 2021/0126189 | A1 | 4/2021 | Sonobe et al. |

* cited by examiner

-Domain sections DS has 2^n domains
-DS has N1 domains
-BUF1 has N2 domains
-BUF2 has N3 domains

MEMORY DEVICE INCLUDING RACETRACK AND OPERATING METHOD THEREOF

CROSS-REFERENCE TO RELATED APPLICATION

This application is based on and claims priority under 35 U.S.C. § 119 to Korean Patent Application No. 10-2022-0048301, filed on Apr. 19, 2022, in the Korean Intellectual Property Office, the disclosure of which is incorporated by reference herein in its entirety.

BACKGROUND

The inventive concept relates to a memory device and an operating method of the memory device.

Racetrack magnetic memories include a racetrack including a series of domains having a state according to stored data, and may move domains by a current flowing through a track, thereby reading data stored in a domain or writing data in a domain.

Accordingly, an efficient method of reading data stored in a domain or writing data in a domain may be needed.

SUMMARY

The inventive concept may provide a memory device for minimizing a buffer region of a racetrack magnetic memory to reduce an area, and an operating method of the memory device.

The inventive concept may provide a memory device for controlling a plurality of racetrack magnetic memories by one domain index controller to reduce a domain shift, reading or writing time, and/or power consumption, and an operating method of the memory device.

According to some embodiments of the inventive concept, there is provided a memory device including a plurality of first racetracks each including a series of domains, a bit line driver connected to first sides of ones of the plurality of first racetracks, a first domain index controller configured to shift domains of ones of the plurality of first racetracks, a plurality of first magnetic tunnel junction (MTJ) devices adjacent to the plurality of first racetracks, a plurality of first cell transistors respectively connected to ones of the plurality of first MTJ devices, and a source line driver connected to the plurality of first cell transistors by a plurality of first source lines. The series of domains includes a series of domain sections, and the plurality of first MTJ devices are respectively adjacent to the series of domain sections.

According to some embodiments of the inventive concept, there is provided a memory device including a plurality of first racetracks each including a series of domains, a source line driver connected to first sides of ones of the plurality of first racetracks, a first domain index controller configured to shift domains of ones of the plurality of first racetracks, a plurality of first magnetic tunnel junction (MTJ) devices adjacent to the plurality of first racetracks, a plurality of first cell transistors respectively connected to ones of the plurality of first MTJ devices, and a bit line driver connected to the plurality of first cell transistors by a plurality of first bit lines. The series of domains of each of the plurality of first racetracks includes a series of domain sections, and the plurality of first MTJ devices are respectively adjacent to the series of domain sections.

According to some embodiments of the inventive concept, there is provided an operating method of a memory device, the operating method including shifting domains of a plurality of first racetracks by a first domain index controller, based on a first address selecting ones of a plurality of first magnetic tunnel junction (MTJ) devices adjacent to the plurality of first racetracks, based on a second address, and reading or writing data based on currents having passed through the plurality of first racetracks and ones of the plurality of the first MTJ devices. The selecting the ones of the plurality of first MTJ devices includes selecting one of a series first MTJ devices adjacent to each of the plurality of first racetracks.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, various embodiments are described with reference to the accompanying drawings.

Figure 1:
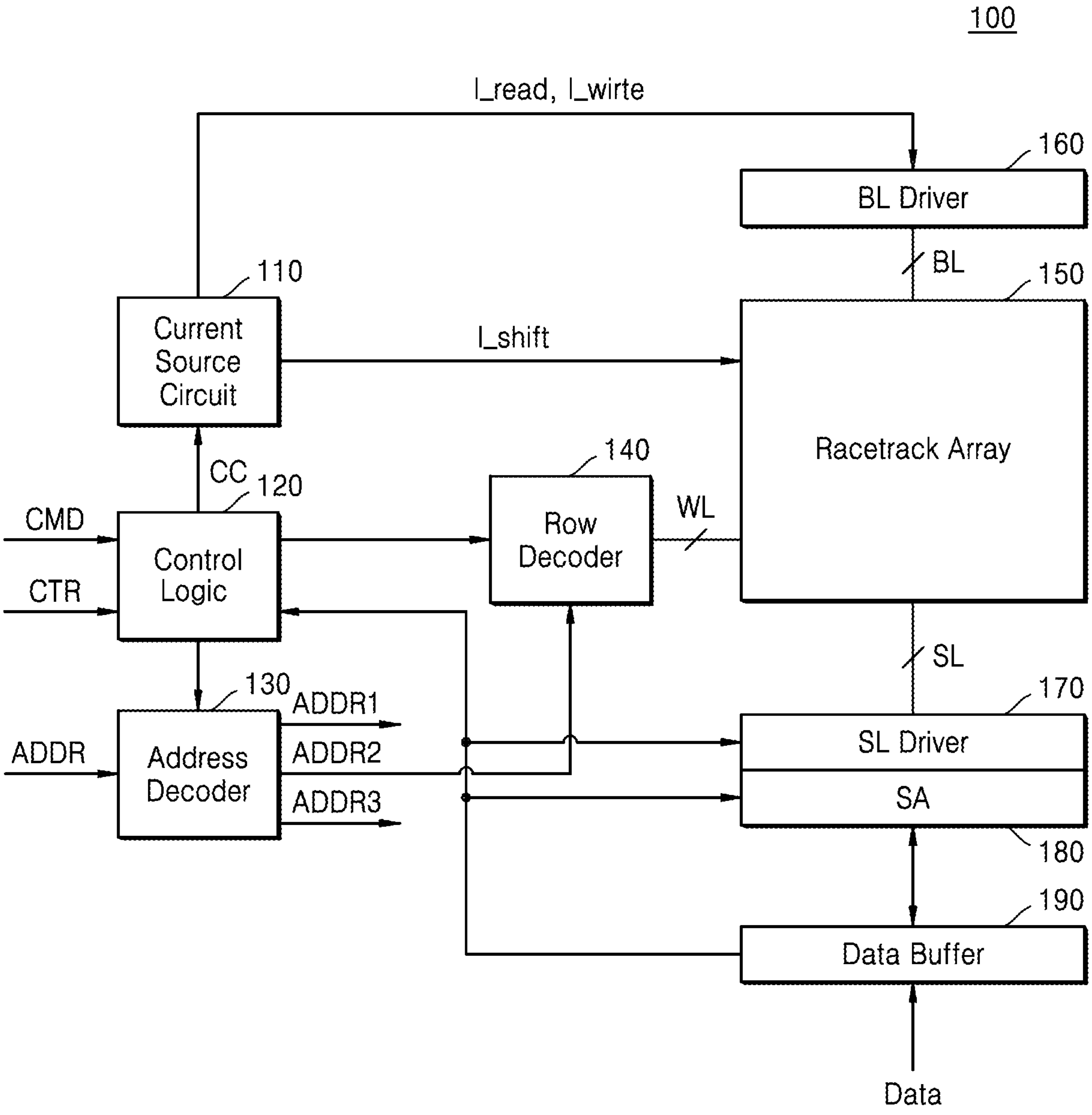
FIG. 1 is a block diagram illustrating a memory device according to some embodiments.

FIG. 1 is a block diagram illustrating a memory device 100 according to some embodiments.

Referring to FIG. 1, the memory device 100 may include a current source circuit 110, a control logic 120, an address decoder 130, a row decoder 140, a racetrack array 150, a bit line driver 160, a source line driver 170, a sense amplification circuit 180, and a data buffer 190. Of course, this configuration is illustrative, and according to particular implementation purposes, some components may be omitted, or a new component may be added.

The current source circuit 110 may provide a read current I_read or a write current I_write to the bit line driver 160. The current source circuit 110 may provide a shift current I_shift to the racetrack array 150 to shift domains of the racetrack array 150. The current source circuit 110 may provide the read current I_read or the write current I_write to the bit line driver 160 to read or write data from or in the racetrack array 150. In addition, the current source circuit 110 may include a voltage source circuit (not shown), and the voltage source circuit may provide a read voltage and a write voltage.

The control logic 120 may control a general operation of the memory device 100. For example, the control logic 120 may control the address decoder 130, the row decoder 140, the bit line driver 160, the source line driver 170, the sense amplification circuit 180, and the like. In particular, the control logic 120 may transmit a current control command CC to the current source circuit 110 to control a magnitude of the shift current I_shift provided from the current source circuit 110 to the racetrack array 150, magnitudes of the read current I_read and the write current I_write provided from the current source circuit 110 to the bit line driver 160, a direction of the shift current I_shift, the read current I_read, or the write current I_write, and the like. The control logic 120 may operate in response to a command signal CMD or a control signal CTR input from the outside.

The address decoder 130 may receive an address ADDR and output a first address ADDR1, a second address ADDR2, and/or a third address ADDR3. The first address ADDR1 may be used to shift a domain of the racetrack array 150. The second address ADDR2 may be transmitted to the row decoder 140. The row decoder 140 may decode the second address ADDR2. The third address ADDR3 may be used to select one or more of a plurality of domain index controllers.

The row decoder 140 may receive the second address ADDR2. The row decoder 140 may enable one of a plurality of word lines WL in response to the second address ADDR2.

The bit line driver 160 may be connected to the racetrack array 150 through a plurality of bit lines BL and connected to the current source circuit 110. The bit line driver 160 may receive the first address ADDR1 and the third address ADDR3 from the address decoder 130. The bit line driver 160 may select at least one of the plurality of bit lines BL in response to the third address ADDR3.

The source line driver 170 may operate under control of the control logic 120. The source line driver 170 may apply a voltage and/or a current to at least one racetrack array 150 connected to the plurality of bit lines BL.

The sense amplification circuit 180 may operate under control by the control logic 120. The sense amplification circuit 180 may sense a current and/or a voltage flowing through a plurality of source lines SL to read or write data from or in the racetrack array 150. The sense amplification circuit 180 may output the read data to the data buffer 190.

The data buffer 190 may operate under control of the control logic 120. The data buffer 190 may transmit data input from the outside to the source line driver 170 or receive data from the sense amplification circuit 180.

The racetrack array 150 is described below with reference to FIG. 2.

Figure 2:
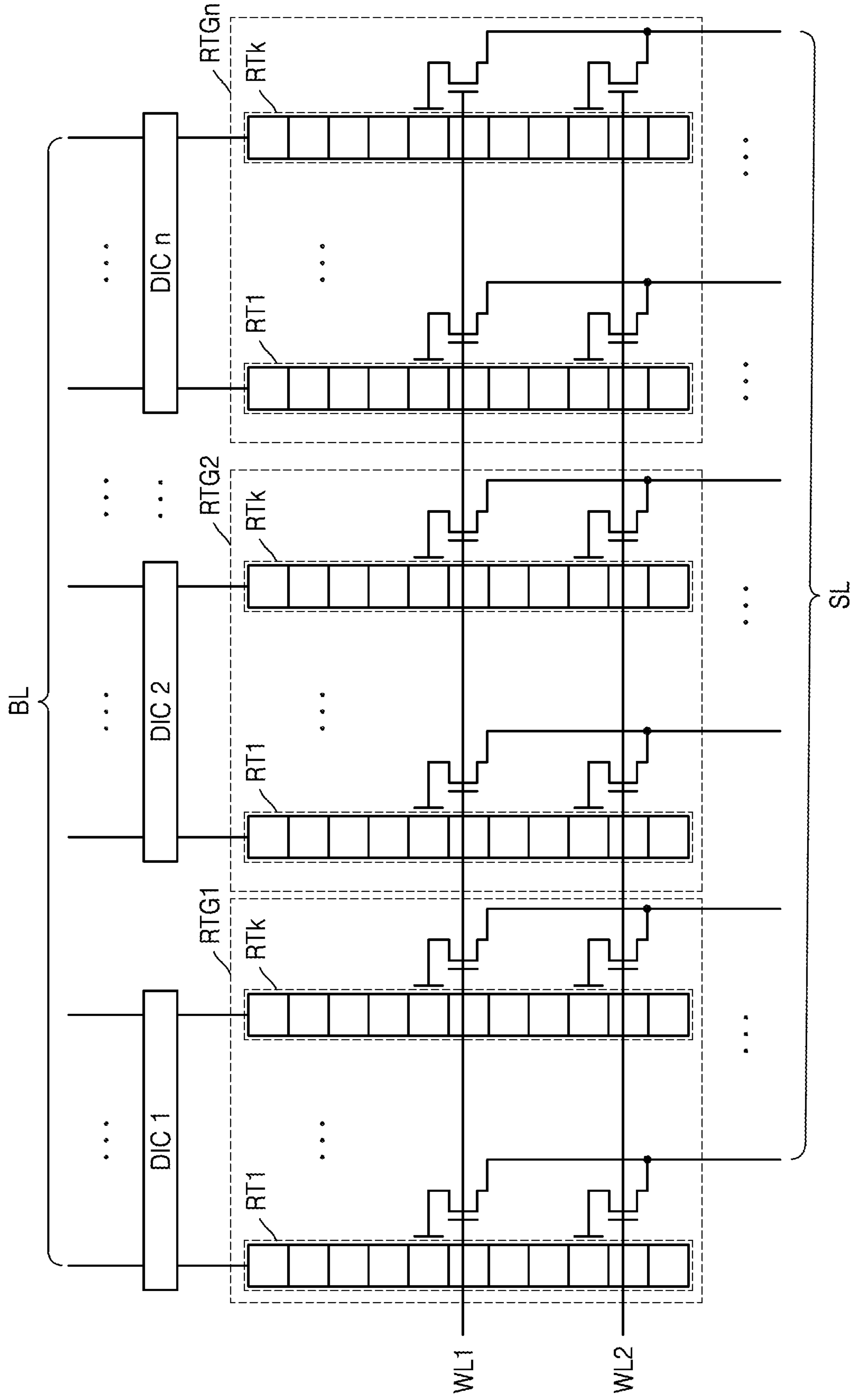
FIG. 2 is a structural diagram of a racetrack array according to some embodiments.

FIG. 2 is a structural diagram of a racetrack array according to some embodiments.

The racetrack array 150 of FIG. 1 may include a plurality of racetrack groups RTG1 to RTGn as shown in FIG. 2.

Referring to FIG. 2, the racetrack array 150 may include a plurality of domain index controllers DIC1 to DICn (n is natural number greater than or equal to 2) and a plurality of racetrack groups RTG1 to RTGn.

The plurality of domain index controllers DIC1 to DICn may include a first domain index controller DIC1, a second domain index controller DIC2, and an nth domain index controller DICn. Herein, n is a natural number greater than 1. One end of the first to nth domain index controllers DIC1 to DICn may be connected to at least one bit line BL, and the other end thereof may be connected to the plurality of racetrack groups RTG1 to RTGn. The first to nth domain index controllers DIC1 to DICn may shift domains of the plurality of racetrack groups RTG1 to RTGn connected to the other end thereof. The first to nth domain index controllers DIC1 to DICn may store locations of domains to be shifted.

The first to nth domain index controllers DIC1 to DICn may receive the first address ADDR1 and the third address ADDR3. The first to nth domain index controllers DIC1 to DICn may shift domains of the plurality of racetrack groups RTG1 to RTGn based on the first address ADDR1. At least one of the first to nth domain index controllers DIC1 to DICn may be enabled in response to the third address ADDR3.

The plurality of racetrack groups RTG1 to RTGn may include a first racetrack group RTG1, a second racetrack group RTG2, and an nth racetrack group RTGn. Each of the first to nth racetrack groups RTG1 to RTGn may include a plurality of racetracks RT1 to RTk. Each of the first to nth racetrack groups RTG1 to RTGn may include first to nth racetracks RT1 to RTk. The first to nth racetrack groups RTG1 to RTGn may be connected to the first to nth domain index controllers DIC1 to DICn, respectively.

As shown in FIG. 2, because the racetrack array 150 includes the first to nth domain index controllers DIC1 to DICn, the racetrack array 150 may manage a racetrack group connected to each domain index controller, thereby reducing a domain shift time and simultaneously performing reading or writing on a plurality of racetracks.

Figure 3:
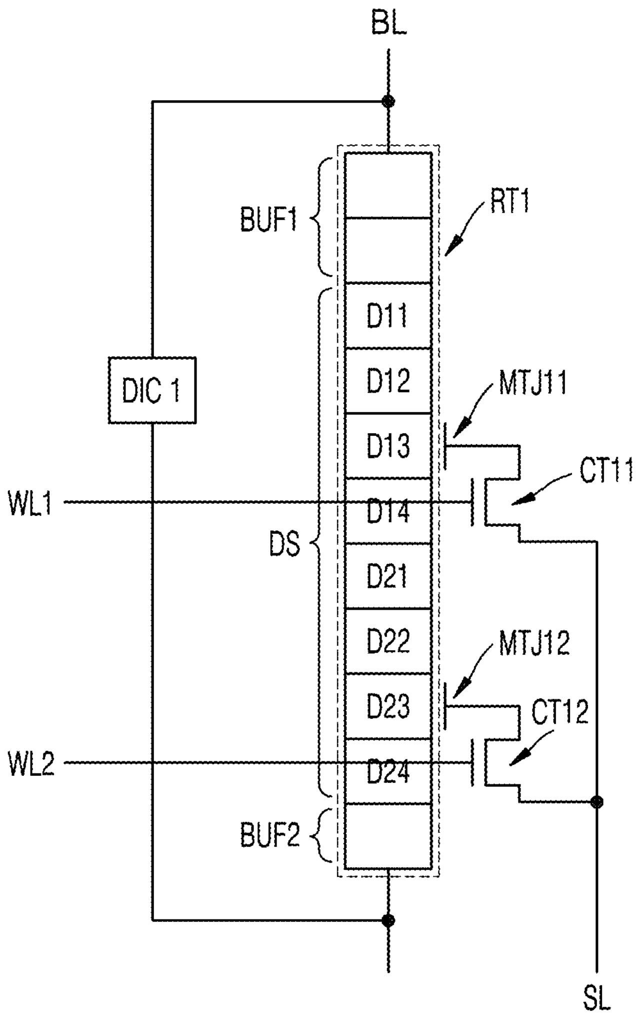
FIG. 3 illustrates a portion of the racetrack array of FIG. 2.

FIG. 3 illustrates a portion of the racetrack array of FIG. 2.

Referring to FIG. 3, the first racetrack RT1 of the first racetrack group RTG1 may include a series of domains. The first racetrack RT1 may include first buffer domains BUF1, domain sections DS, and second buffer domains BUF2. Each of the first buffer domains BUF1, the domain sections DS, and the second buffer domains BUF2 may include a series of domains. The domain sections DS may be between the first buffer domains BUF1 and the second buffer domains BUF2.

The domain sections DS may include a first domain D11, a second domain D12, a third domain D13, a fourth domain D14, a fifth domain D21, a sixth domain D22, a seventh domain D23, and an eighth domain D24. The first to eighth domains D11 to D14 and D21 to D24 included in the domain sections DS may store data therein. The first buffer domains BUF1 and the second buffer domains BUF2 may store data therein.

Each of the domain sections DS may include a first number N1 of domains. The first buffer domains BUF1 may include a second number N2 of domains. The second buffer domains BUF2 may include a third number N3 of domains. The first number N1 may be greater than the second number N2 or the third number N3. The second number N2 or the third number N3 may correspond to a half of the first number N1. In addition, the second number N2 or the third number N3 may vary depending on the first number N1.

Referring back to FIG. 3, it is illustrated as a non-limiting example that the first number N1 is 4, the second number N2 is 2, and the third number N3 is 1.

In addition, the racetrack array may include a first MTJ device MTJ11, a first cell transistor CT11, a second MTJ device MTJ12, and a second cell transistor CT12. The first MTJ device MTJ11, the first cell transistor CT11, the second MTJ device MTJ12, and the second cell transistor CT12 may be adjacent to the domain sections DS.

For example, the first MTJ device MTJ11 may be adjacent to the third domain D13. A gate of the first cell transistor CT11 may be connected to one of the plurality of word lines WL, one end thereof may be connected to the first MTJ device MTJ11, and the other end thereof may be connected to one of the plurality of source lines SL. The second MTJ device MTJ12 may be adjacent to the seventh domain D23. A gate of the second cell transistor CT12 may be connected to one of the plurality of word lines WL, one end thereof may be connected to the second MTJ device MTJ12, and the other end thereof may be connected to one of the plurality of source lines SL.

One end of a series of domains of the first racetrack RT1 may be connected to a bit line BL, and the other end thereof may be connected to the first domain index controller DIC1.

Although only a structure of the first racetrack RT1 of the first racetrack group RTG1 has been described for convenience of description, not only the second to nth racetracks RT2 to RTk of the first racetrack group RTG1 but also the first to kth racetracks RT1 to RTk of each of the second to nth racetrack groups RTG2 to RTGn may have the same structure. Referring to FIG. 2 and FIG. 3, the first domain index controller DIC1 may include an n-bit register, and each of the series of domain sections may include $2^n$ domains. Of course, the plurality of domain index controllers DIC1 to DICn may include an n-bit register.

As shown in FIG. 3, the racetrack array includes the first racetrack RT1, the first and second MTJ devices MTJ11 and MTJ12, and the first and second cell transistors CT11 and CT12, and thus, a time for shifting domains of each racetrack and the number of shifts may be reduced.

In addition, because the racetrack array includes the first and second MTJ devices MTJ11 and MTJ12 and the first and second cell transistors CT11 and CT12, the numbers of respective series of domains included in the first buffer domains BUF1 and the second buffer domains BUF2 may be reduced, thereby minimizing the size of a memory device.

That is, because a plurality of MTJ devices and a plurality of cell transistors are adjacent to domain sections DS, respectively, a time for shifting each domain and the number of shifts may be reduced, and because the numbers of respective series of domains included in the first buffer domains BUF1 and the second buffer domains BUF2 are reduced, the size of a memory device may be minimized.

Figure 4A:
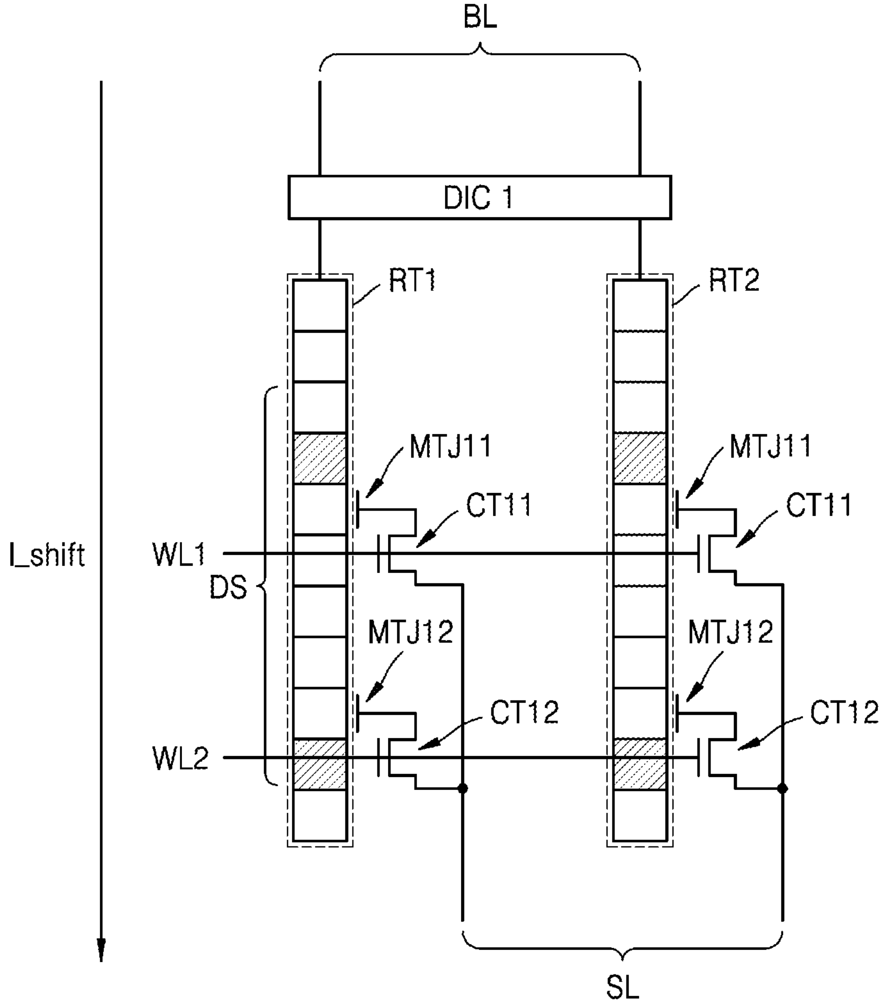
FIG. 4A illustrates a portion of a racetrack array before a domain shift occurs, according to some embodiments.
Figure 4B:
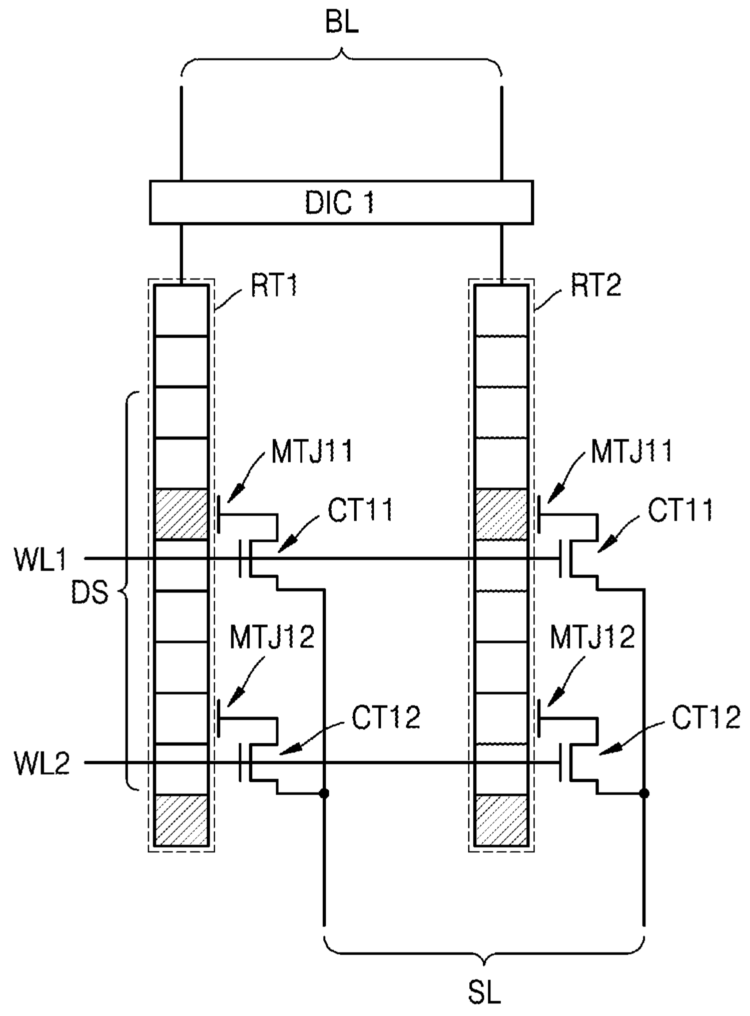
FIG. 4B illustrates the portion of the racetrack array after the domain shift has occurred, according to some embodiments.
Figure 4C:
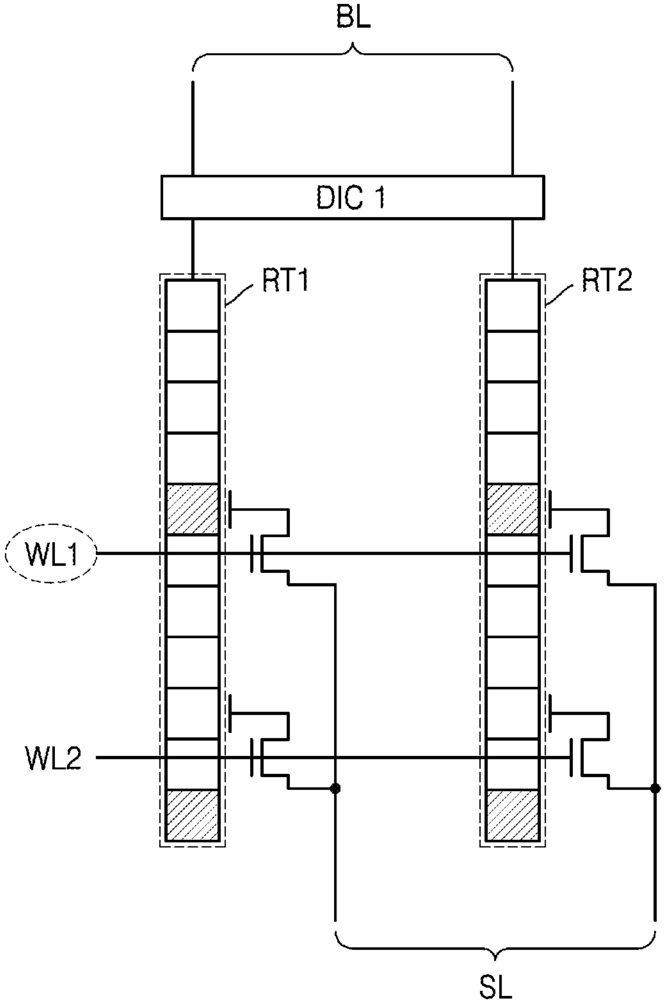
FIG. 4C illustrates a read or write operation when a word line is enabled, according to some embodiments.

FIG. 4A illustrates a portion of a racetrack array before a domain shift occurs, according to some embodiments. FIG. 4B illustrates the portion of the racetrack array after the domain shift has occurred, according to some embodiments. FIG. 4C illustrates a read or write operation when a word line is enabled, according to some embodiments.

First, referring to FIG. 4A, data is stored in the domain sections DS of the first racetrack RT1 and the second racetrack RT2. Based on the first address ADDR1, the first domain index controller DIC1 may shift domains of the first racetrack RT1 and the second racetrack RT2. Although FIG. 4A shows that the shift current I_shift flows in a direction from a bit line BL to a source line SL, the direction of the shift current I_shift may be opposite to the shown direction.

Referring to FIG. 4B, data stored in the domain sections DS of the first racetrack RT1 and the second racetrack RT2 is domain-shifted. Based on the second address ADDR2, the row decoder 140 may enable a first or second word line WL1 or WL2.

For example, when the first word line WL1 is enabled, the plurality of first MTJ devices MTJ11 adjacent to the first racetrack RT1 and the second racetrack RT2 may be enabled. When the second word line WL2 is enabled, the plurality of second MTJ devices MTJ12 adjacent to the first racetrack RT1 and the second racetrack RT2 may be enabled.

That is, based on the second address ADDR2, some of the first and second MTJ devices MTJ11 and MTJ12 adjacent to the first racetrack RT1 and the second racetrack RT2 may be selected.

Referring to FIG. 4C, the first word line WL1 may be enabled to read data stored in the first racetrack RT1 or write data in the first racetrack RT1. The read current I_read or the write current I_write may have less magnitude than the shift current I_shift.

For example, when the first word line WL1 is enabled, the first MTJ device MTJ11 among a plurality of MTJ devices adjacent to the first racetrack RT1 may be selected.

A domain index controller may control a plurality of racetracks, thereby reducing an operating time and power of a memory device.

Figure 5:
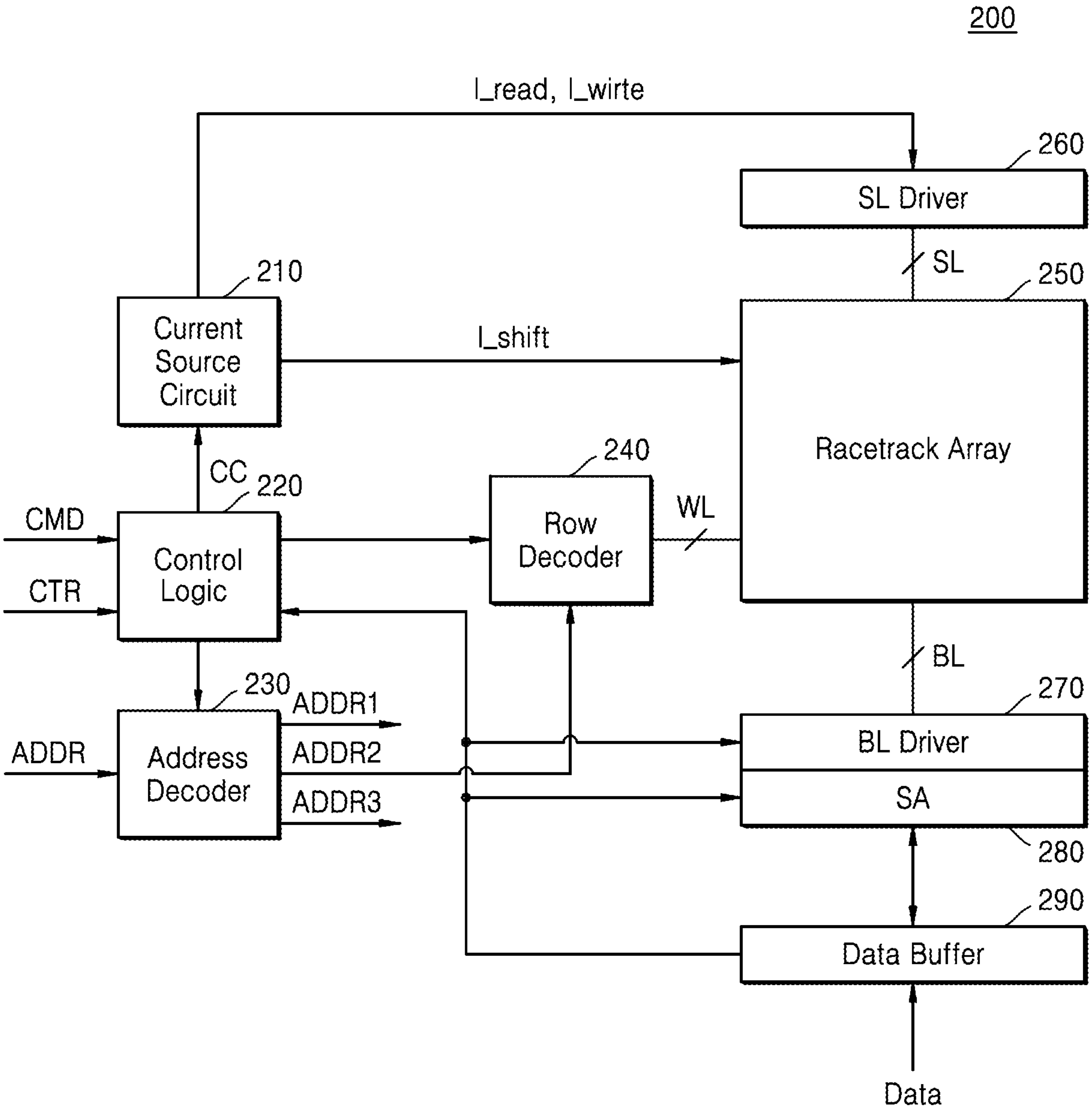
FIG. 5 is a block diagram illustrating a memory device according to some embodiments.

FIG. 5 is a block diagram illustrating a memory device 200 according to some embodiments. Hereinafter, a description made with reference to FIG. 1 is not repeated.

Referring to FIG. 5, the memory device 200 may include a current source circuit 210, a control logic 220, an address decoder 230, a row decoder 240, a racetrack array 250, a source line driver 260, a bit line driver 270, a sense amplification circuit 280, and a data buffer 290.

The current source circuit 210 may provide the read current I_read or the write current I_write to the source line driver 260. The current source circuit 210 may provide the shift current I_shift to the racetrack array 250 to shift domains of the racetrack array 250. The current source circuit 210 may provide the read current I_read or the write current I_write to the source line driver 260 to read or write data from or in the racetrack array 250.

The control logic 220 may transmit the current control command CC to the current source circuit 210 to control a magnitude of the shift current I_shift provided from the current source circuit 210 to the racetrack array 250, magnitudes of the read current I_read and the write current I_write provided from the current source circuit 210 to the source line driver 260, a direction of the shift current I_shift, the read current I_read, or the write current I_write, and the like.

The source line driver 260 may be connected to the racetrack array 250 through the plurality of source lines SL and connected to the current source circuit 210. The source line driver 260 may receive the first address ADDR1 and the third address ADDR3 from the address decoder 230. The source line driver 260 may select at least one of the plurality of source lines SL in response to the third address ADDR3.

The bit line driver 270 may apply a voltage and/or a current to at least one racetrack array 150 connected to the plurality of bit lines BL.

The sense amplification circuit 280 may sense a current and/or a voltage flowing through the plurality of bit lines BL to read or write data from or in the racetrack array 250.

The data buffer 290 may transmit data input from the outside to the bit line driver 270 or receive data from the sense amplification circuit 280.

Figure 6:
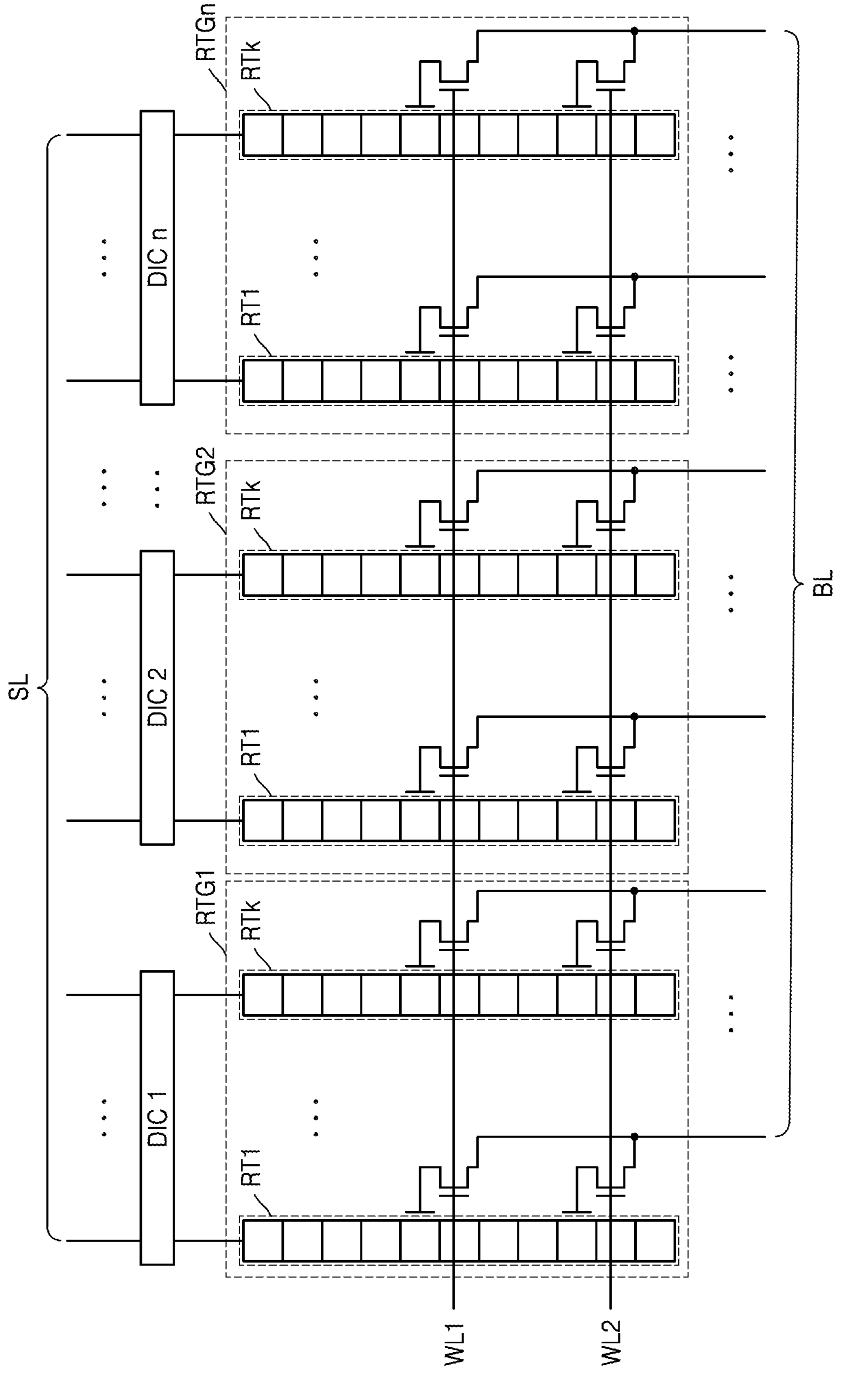
FIG. 6 is a structural diagram of a racetrack array according to some embodiments.

FIG. 6 is a structural diagram of a racetrack array according to some embodiments. Hereinafter, a description made with reference to FIG. 2 is not repeated.

The racetrack array 250 may include the plurality of domain index controllers DIC1 to DICn and the plurality of racetrack groups RTG1 to RTGn.

One end of the first to nth domain index controllers DIC1 to DICn may be connected to at least one source line SL, and the other end thereof may be connected to the plurality of racetrack groups RTG1 to RTGn.

The plurality of domain index controllers DIC1 to DICn may include the first domain index controller DIC1, the second domain index controller DIC2, and the nth domain index controller DICn. Herein, n is a natural number greater than 1. The first to nth domain index controllers DIC1 to DICn may shift domains of the plurality of racetrack groups RTG1 to RTGn connected to the other end thereof. The first to nth domain index controllers DIC1 to DICn may store locations of domains to be shifted.

The first to nth domain index controllers DIC1 to DICn may receive the first address ADDR1 and the third address ADDR3. The first to nth domain index controllers DIC1 to DICn may shift domains of the plurality of racetrack groups RTG1 to RTGn based on the first address ADDR1. At least one of the first to nth domain index controllers DIC1 to DICn may be enabled in response to the third address ADDR3.

The plurality of racetrack groups RTG1 to RTGn may include the first racetrack group RTG1, the second racetrack group RTG2, and the nth racetrack group RTGn. Each of the first to nth racetrack groups RTG1 to RTGn may include the plurality of racetracks RT1 to RTk. Each of the first to nth racetrack groups RTG1 to RTGn may include the first to nth racetracks RT1 to RTk. The first to nth racetrack groups RTG1 to RTGn may be connected to the first to nth domain index controllers DIC1 to DICn, respectively.

As shown in FIG. 5, because the racetrack array 250 includes the first to nth domain index controllers DIC1 to DICn, the racetrack array 250 may manage a racetrack group connected to each domain index controller, thereby reducing a domain shift time and simultaneously performing reading or writing on a plurality of racetracks.

Figure 7:
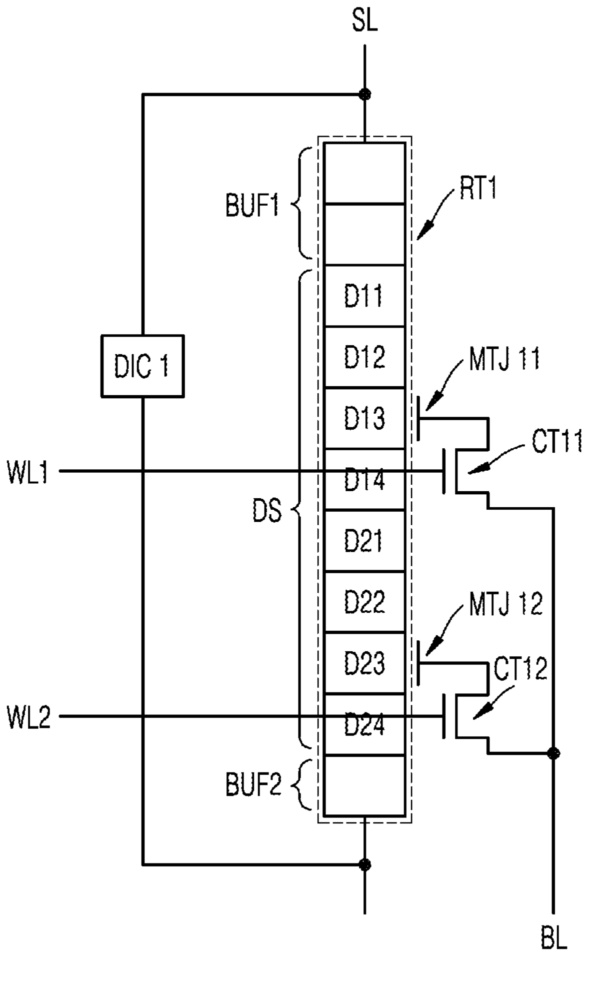
FIG. 7 illustrates a portion of the racetrack array of FIG. 6.

FIG. 7 illustrates a racetrack according to some embodiments. Hereinafter, a description made with reference to FIG. 3 is not repeated.

Referring to FIG. 7, the first racetrack RT1 of the first racetrack group RTG1 may include a series of domains. The first racetrack RT1 may include the first buffer domains BUF1, the domain sections DS, and the second buffer domains BUF2. Each of the first buffer domains BUF1, the domain sections DS, and the second buffer domains BUF2 may include a series of domains. The domain sections DS may be between the first buffer domains BUF1 and the second buffer domains BUF2.

Each of the domain sections DS may include the first number N1 of domains. The first buffer domains BUF1 may include the second number N2 of domains. The second buffer domains BUF2 may include the third number N3 of domains. The first number N1 may be greater than the second number N2 or the third number N3. The second number N2 or the third number N3 may correspond to a half of the first number N1. In addition, the second number N2 or the third number N3 may vary depending on the first number N1.

Referring back to FIG. 7, it is illustrated that the first number N1 is 4, the second number N2 is 2, and the third number N3 is 1.

As shown in FIG. 7, the racetrack array includes the first racetrack RT1, the first and second MTJ devices MTJ11 and MTJ12, and the first and second cell transistors CT11 and CT12, and thus, a time for shifting domains of each racetrack and the number of shifts may be reduced.

In addition, the racetrack array may include the first MTJ device MTJ11, the first cell transistor CT11, the second MTJ device MTJ12, and the second cell transistor CT12. The first MTJ device MTJ11, the first cell transistor CT11, the second MTJ device MTJ12, and the second cell transistor CT12 may be adjacent to the domain sections DS.

In addition, because racetrack array includes the first and second MTJ devices MTJ11 and MTJ12 and the first and second cell transistors CT11 and CT12, the numbers of respective series of domains included in the first buffer domains BUF1 and the second buffer domains BUF2 may be reduced, thereby minimizing the size of a memory device.

That is, because a plurality of MTJ devices and a plurality of cell transistors are adjacent to domain sections DS, respectively, a time for shifting each domain and the number of shifts may be reduced, and because the numbers of respective series of domains included in the first buffer domains BUF1 and the second buffer domains BUF2 are reduced, the size of a memory device may be minimized.

Figure 8A:
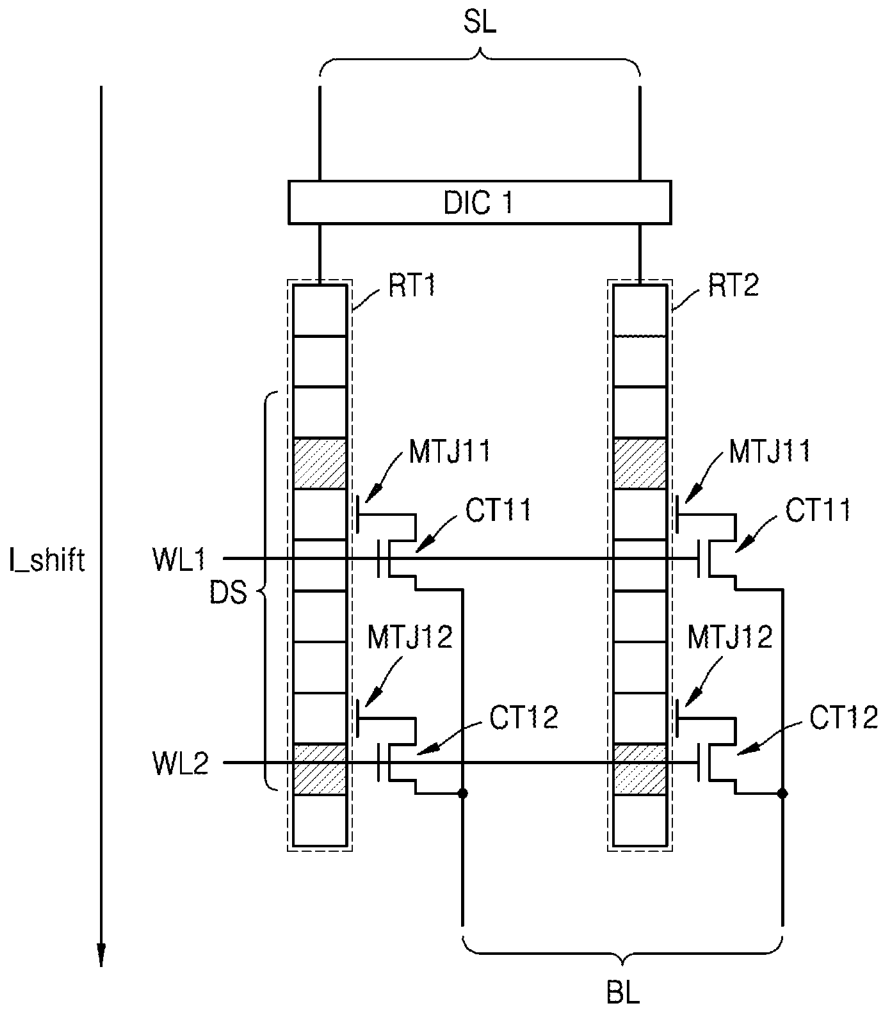
FIG. 8A illustrates a portion of a racetrack array before a domain shift occurs, according to some embodiments.
Figure 8B:
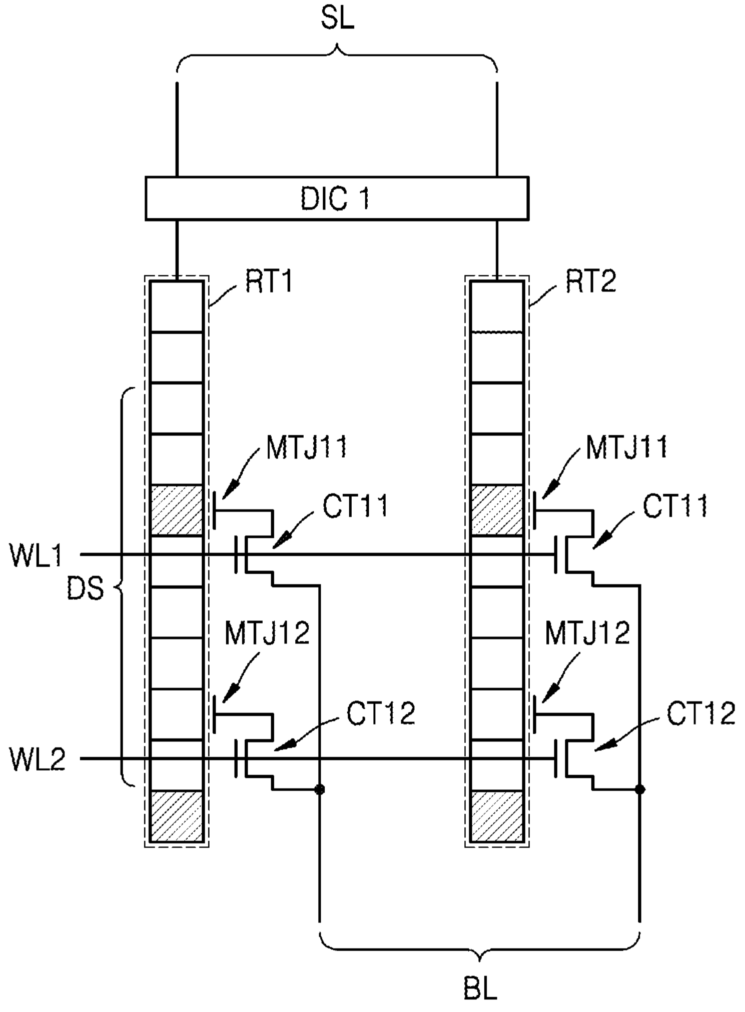
FIG. 8B illustrates the portion of the racetrack array after the domain shift has occurred, according to some embodiments.
Figure 8C:
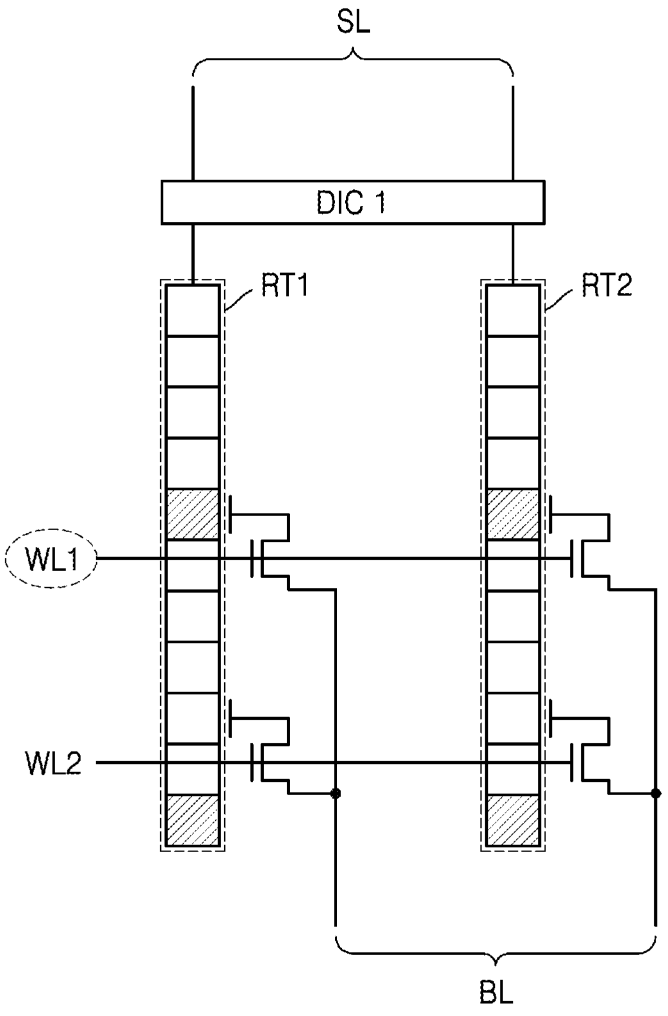
FIG. 8C illustrates a read or write operation when a word line is enabled, according to some embodiments.

FIG. 8A illustrates a portion of a racetrack array before a domain shift occurs, according to some embodiments. FIG. 8B illustrates the portion of the racetrack array after the domain shift has occurred, according to some embodiments. FIG. 8C illustrates a read or write operation when a word line is enabled, according to some embodiments. Hereinafter, a description made with reference to FIGS. 4A to 4C is not repeated.

First, referring to FIG. 8A, data is stored in the domain sections DS of the first racetrack RT1 and the second racetrack RT2. Based on the first address ADDR1, the first domain index controller DIC1 may shift domains of the first racetrack RT1 and the second racetrack RT2. Although FIG. 8A shows that the shift current I_shift flows in a direction from a source line SL to a bit line BL, the direction of the shift current I_shift may be opposite to the shown direction.

Referring to FIG. 8B, data stored in the domain sections DS of the first racetrack RT1 and the second racetrack RT2 is domain-shifted. Based on the second address ADDR2, the row decoder 140 may enable the first or second word line WL1 or WL2.

For example, when the first word line WL1 is enabled, the a plurality of first MTJ devices MTJ11 adjacent to the first racetrack RT1 and the second racetrack RT2 may be enabled. When the second word line WL2 is enabled, the a plurality of second MTJ devices MTJ12 adjacent to the first racetrack RT1 and the second racetrack RT2 may be enabled.

That is, based on the second address ADDR2, some of the first and second MTJ devices MTJ11 and MTJ12 adjacent to the first racetrack RT1 and the second racetrack RT2 may be selected.

Referring to FIG. 8C, the first word line WL1 may be enabled to read data stored in the first racetrack RT1 or write data in the first racetrack RT1. The read current Lread or the write current I_write may have less magnitude than the shift current I_shift.

For example, when the first word line WL1 is enabled, the first MTJ device MTJ11 among a plurality of MTJ devices adjacent to the first racetrack RT1 may be selected.

A domain index controller may control a plurality of racetracks, thereby reducing an operating time and power of a memory device.

Figure 9:
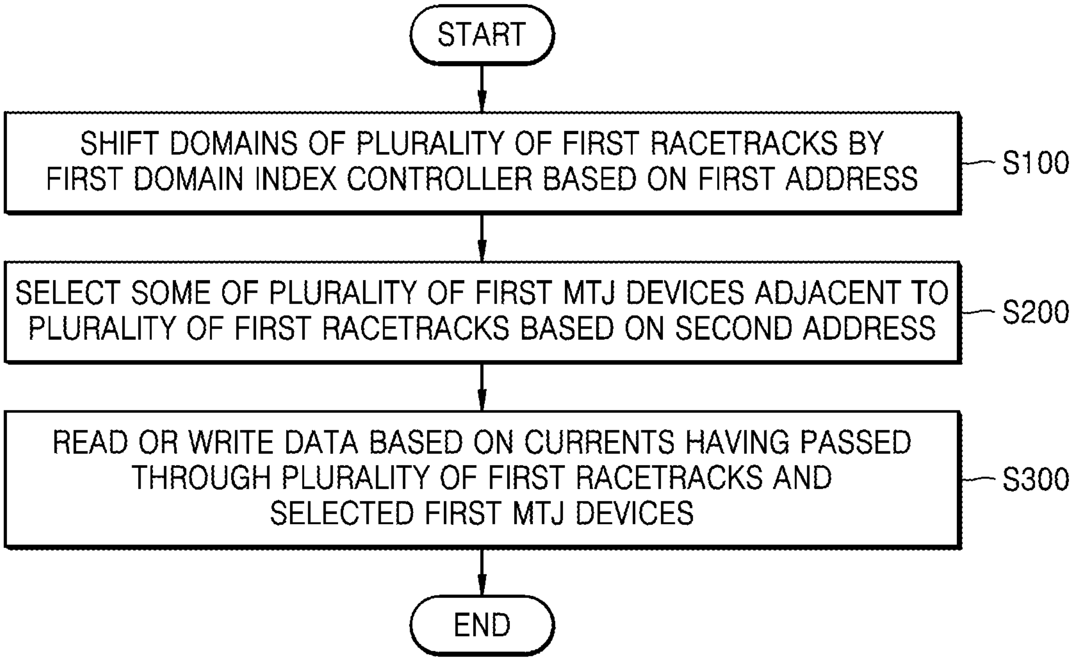
FIG. 9 is a flowchart illustrating an operating method of a memory device, according to some embodiments.

FIG. 9 is a flowchart illustrating an operating method of a memory device, according to some embodiments.

Referring to FIG. 9, first, domains of a plurality of first racetracks may be shifted by a first domain index controller based on a first address in operation S100.

For example, based on the first address ADDR1, the first domain index controller DIC1 may shift domains of the first racetrack RT1 and the second racetrack RT2. The shifting the domains of the plurality of first racetracks may include providing the shift current I_shift to the plurality of first racetracks.

Next, some of a plurality of first MTJ devices adjacent to the plurality of first racetracks may be selected based on a second address in operation S200.

For example, based on the second address ADDR2, the first or second word line WL1 or WL2 may be enabled. When the first word line WL1 is enabled, the a plurality of first MTJ devices MTJ11 adjacent to the first racetrack RT1 and the second racetrack RT2 may be selected.

The selecting the some of the plurality of first MTJ devices may include selecting one of a series of first MTJ devices respectively adjacent to the plurality of first racetracks.

Finally, data may be read or written based on currents having passed through the plurality of first racetracks and the selected first MTJ devices in operation S300.

For example, when the first word line WL1 is enabled, the first MTJ devices MTJ11 adjacent to the first racetrack RT1 may read or write data based on the read current I_read or the write current I_write.

The reading or writing the data may include providing the read current I_read or the write current I_write, which has less magnitude than the shift current I_shift, to the plurality of first racetracks.

Figure 10:
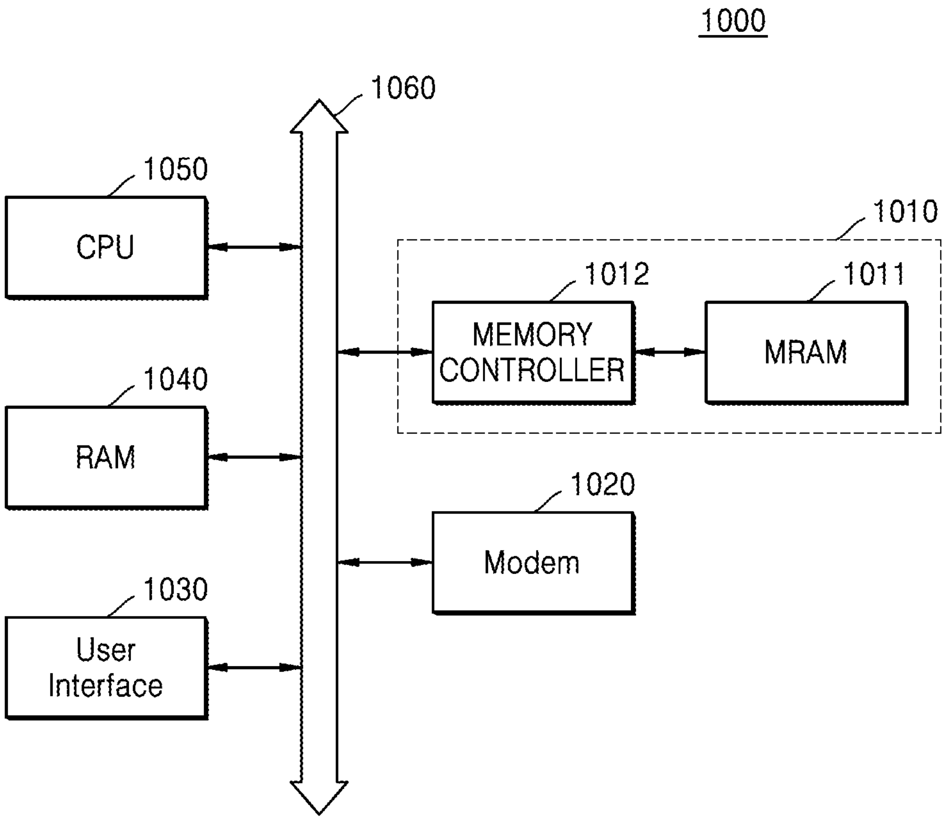
FIG. 10 is a block diagram illustrating a computing system including a memory device according to some embodiments.

FIG. 10 is a block diagram illustrating a computing system 1000 including a memory device 1010 according to some embodiments.

Referring to FIG. 10, the memory device 1010 may be mounted in the computing system 1000. The computing system 1000 may include a memory system 10, a modem 1020, a user interface 1030, random access memory (RAM) 1040, and a central processing unit (CPU) 1050 electrically connected to a system bus 1060. The memory device 1010 may include a magnetic random access memory (MRAM) chip 1011 including a spin torque transfer (STT)-MRAM cell, and the memory device 1010 may be an MRAM system including the MRAM chip 1011. In addition, it would be obvious to those of ordinary skill in the art that the computing system 1000 may further include an application chipset, a camera image processor (CIS), an input/output device, and the like.

In some embodiments, the computing system 1000 may correspond to a desktop computer, a server computer, a laptop computer, a tablet computer, a smartphone, a wearable device, or the like, but the scope of the inventive concept is not limited thereto.

In some embodiments, the memory system 1000 may include the memory device such as MRAM 1011 and a memory controller 1012. Data processed by the CPU 1050 or data input from the outside may be stored in the memory device 1010. Herein, the memory device 1010 may be implemented by using the embodiments described above with reference to FIGS. 1 to 9.

While the inventive concept has been particularly shown and described with reference to embodiments thereof, it will be understood that various changes in form and details may be made therein without departing from the spirit and scope of the following claims.

What is claimed is:

1. A memory device comprising:

a plurality of first racetracks, wherein each of the plurality of first racetracks comprises a series of domains;

a bit line driver connected to first sides of ones of the plurality of first racetracks;

a first domain index controller configured to shift domains of the ones of the plurality of first racetracks;

a plurality of first magnetic tunnel junction (MTJ) devices adjacent to the plurality of first racetracks;

a plurality of first cell transistors respectively connected to ones of the plurality of first MTJ devices; and a source line driver connected to the plurality of first cell transistors by a plurality of first source lines, wherein the series of domains comprises a series of domain sections that are adjacent to each other, wherein the plurality of first MTJ devices are respectively adjacent to the series of domain sections, and wherein the series of domains comprises a series of first domains, the memory device further comprising:

a plurality of second racetracks each comprising a series of second domains;

a second domain index controller configured to shift second domains among the series of second domains of the plurality of second racetracks;

a plurality of second MTJ devices adjacent to the plurality of second racetracks; and a plurality of second cell transistors respectively connected to ones of the plurality of second MTJ devices, wherein the bit line driver is connected to first sides of ones of the plurality of second racetracks, and the source line driver is connected to the plurality of second cell transistors by a plurality of second source lines.

2. The memory device of claim 1, wherein each of the series of domain sections comprises a first number of domains, wherein the series of first buffer domains comprises a second number of domains, wherein the second number is less than the first number, wherein the series of second buffer domains comprises a third number of domains, and wherein the third number is less than the first number.

3. The memory device of claim 1, wherein the bit line driver is connected to the series of first buffer domains of the plurality of first racetracks.

4. The memory device of claim 1, further comprising:

a row decoder configured to drive a plurality of word lines, wherein each of the plurality of first cell transistors is connected to a respective one of the plurality of word lines.

5. The memory device of claim 4, wherein the first domain index controller is further configured to shift domains among the series of domains of the plurality of first racetracks based on a first address, and wherein the row decoder is further configured to enable one of the plurality of word lines based on a second address.

6. The memory device of claim 1, wherein the first domain index controller and the second domain index controller are configured to be enabled in response to a third address.

7. The memory device of claim 1, wherein the first domain index controller comprises an n-bit register, and wherein each of the series of domain sections comprises $2^n$ domains.

8. A memory device comprising:

a plurality of first racetracks, wherein each of the plurality of first racetracks comprises a series of domains;

a source line driver connected to first sides of ones of the plurality of first racetracks;

a first domain index controller configured to shift domains of the ones of the plurality of first racetracks;

a plurality of first magnetic tunnel junction (MTJ) devices adjacent to the plurality of first racetracks;

a plurality of first cell transistors respectively connected to ones of the plurality of first MTJ devices; and a bit line driver connected to the plurality of first cell transistors by a plurality of first bit lines, wherein the series of domains comprises a series of domain sections that are adjacent to each other, wherein the plurality of first MTJ devices are respectively adjacent to the series of domain sections, and wherein the series of domains comprises a series of first domains, the memory device further comprising:

a plurality of second racetracks each comprising a series of second domains;

a second domain index controller configured to shift second domains among the series of second domains of the plurality of second racetracks;

a plurality of second MTJ devices adjacent to the plurality of second racetracks; and a plurality of second cell transistors respectively connected to ones of the plurality of second MTJ devices, wherein the source line driver is connected to first sides of ones of the plurality of second racetracks, and wherein the bit line driver is connected to the plurality of second cell transistors by a plurality of second bit lines.

9. The memory device of claim 8, wherein each of the series of domain sections comprises a first number of domains, wherein the series of first buffer domains comprises a second number of domains, wherein the second number is less than the first number, wherein the series of second buffer domains comprises a third number of domains, and wherein the third number is less than the first number.

10. The memory device of claim 8, wherein the bit line driver is connected to the series of first buffer domains of the plurality of first racetracks.

11. The memory device of claim 8, further comprising:

a row decoder configured to drive a plurality of word lines, wherein each of the plurality of first cell transistors is connected to a respective one of the plurality of word lines.

12. The memory device of claim 11, wherein the first domain index controller is further configured to shift domains among the series of domains of the plurality of first racetracks based on a first address, and wherein the row decoder is further configured to enable one of the plurality of word lines based on a second address.

13. The memory device of claim 8, wherein the first domain index controller and the second domain index controller are enabled in response to a third address.

14. The memory device of claim 8, wherein the first domain index controller comprises an n-bit register, and wherein each of the series of domain sections comprises $2^n$ domains.

15. An operating method of a memory device, the operating method comprising:

shifting domains of a plurality of first racetracks by a first domain index controller, based on a first address;

selecting ones of a plurality of first magnetic tunnel junction (MTJ) devices adjacent to the plurality of first racetracks, based on a second address; and reading or writing data based on currents having passed through the plurality of first racetracks and the ones of the plurality of first MTJ devices that were selected, wherein the selecting the ones of the plurality of first MTJ devices comprises selecting a respective one of a series first MTJ devices adjacent to each of the plurality of first racetracks, wherein the shifting the domains of the plurality of first racetracks comprises providing a first current to the plurality of first racetracks, and wherein the reading or writing the data comprises providing a second current, which has less magnitude than the first current, to the plurality of first racetracks.

16. The memory device of claim 1, wherein each of the plurality of first racetracks comprises a series of first buffer domains and a series of second buffer domains, and wherein the series of domain sections are between the series of first buffer domains and the series of second buffer domains.

17. The memory device of claim 8, wherein each of the plurality of first racetracks comprises a series of first buffer domains and a series of second buffer domains, and wherein the series of domain sections are between the series of first buffer domains and the series of second buffer domains.

* * * * *